US009437526B2

(12) United States Patent
Lim et al.

(10) Patent No.: US 9,437,526 B2
(45) Date of Patent: Sep. 6, 2016

(54) CHIP ON FILM PACKAGE INCLUDING DISTRIBUTED VIA PLUGS

(71) Applicant: SAMSUNG ELECTRONICS CO., LTD., Suwon-si, Gyeonggi-do (KR)

(72) Inventors: So-Young Lim, Hwaseong-si (KR); Na-Rae Shin, Yongin-si (KR); Jeong-Kyu Ha, Hwaseong-si (KR); Kyoung-Suk Yang, Yongin-si (KR); Pa-Lan Lee, Daegu (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 186 days.

(21) Appl. No.: 14/259,200

(22) Filed: Apr. 23, 2014

(65) Prior Publication Data
US 2014/0327148 A1 Nov. 6, 2014

(30) Foreign Application Priority Data

May 6, 2013 (KR) .......................... 10-2013-0050907

(51) Int. Cl.
| H01L 23/498 | (2006.01) |
| H01L 23/495 | (2006.01) |
| H01L 23/482 | (2006.01) |
| H05K 1/11 | (2006.01) |
| H01L 23/00 | (2006.01) |

(52) U.S. Cl.
CPC ......... *H01L 23/49541* (2013.01); *H01L 23/00* (2013.01); *H01L 23/4824* (2013.01); *H01L 23/49838* (2013.01); *H05K 1/118* (2013.01); *H01L 24/16* (2013.01); *H01L 2224/16225* (2013.01)

(58) Field of Classification Search
CPC ............ H01L 23/481; H01L 23/4824; H01L 23/49827; H01L 24/26; H01L 24/28; H01L 24/30; H01L 23/49541; H01L 23/49548; H01L 23/49805; H01L 23/49838; H05K 1/118
See application file for complete search history.

(56) References Cited

U.S. PATENT DOCUMENTS

| 6,853,090 B2 | 2/2005 | Kim et al. |
| 7,217,990 B2 | 5/2007 | Chung |

(Continued)

FOREIGN PATENT DOCUMENTS

| JP | 2008-026497 A | 2/2008 |
| JP | 2008-244069 A | 10/2008 |

(Continued)

*Primary Examiner* — Jose R Diaz
(74) *Attorney, Agent, or Firm* — Lee & Morse, P.C.

(57) ABSTRACT

A chip on film (COF) package includes a film substrate, first leads on a first surface of the film substrate, the first leads having a first length, and second leads on the first surface of the film substrate, the second leads having a second length larger than the first length, first via plugs penetrating the film substrate and connected to first ends of the first leads, and second via plugs penetrating the film substrate and connected to first ends of the second leads, and first connection leads on a second surface of the film substrate facing the first surface, the first connection leads having first ends connected to the first via plugs, and second connection leads on the second surface of the film substrate, the second connection leads having first ends electrically connected to the second via plugs.

18 Claims, 15 Drawing Sheets

(56) References Cited

U.S. PATENT DOCUMENTS

| | | |
|---|---|---|
| 7,238,962 B2 | 7/2007 | Kim |
| 7,414,323 B2 | 8/2008 | Hirae |
| 7,442,968 B2 | 10/2008 | Kim et al. |
| 8,174,662 B2 | 5/2012 | Tseng et al. |
| 8,772,089 B2 * | 7/2014 | Pan .................... H01L 21/4825 257/671 |
| 9,305,990 B2 * | 4/2016 | Jung .................... H01L 27/3276 |
| 2009/0322362 A1 | 12/2009 | Lim et al. |
| 2012/0061669 A1 | 3/2012 | Kim et al. |

FOREIGN PATENT DOCUMENTS

| | | |
|---|---|---|
| KR | 10-2008-0030874 A | 4/2008 |
| KR | 10-2011-0004117 A | 1/2011 |
| KR | 10-2011-0049603 A | 5/2011 |

* cited by examiner

CHIP ON FILM PACKAGE INCLUDING DISTRIBUTED VIA PLUGS

CROSS-REFERENCE TO RELATED APPLICATION

Korean Patent Application No. 10-2013-0050907, filed on May 6, 2013, in the Korean Intellectual Property Office, and entitled: "Chip On Film Package Including Distributed Via Plugs," is incorporated by reference herein in its entirety.

BACKGROUND

1. Field

Embodiments relate to a chip on film (COF) package and a film of a COF package.

2. Description of Related Art

In recent years, to meet miniaturization, thinning, and lightness of electronic products, various COF package technologies using a flexible film substrate have been suggested as a high-density semiconductor chip mounting technology.

SUMMARY

Embodiments are directed to a chip on film (COF) package including a film substrate, first leads on a first surface of the film substrate, the first leads having a first length, and second leads on the first surface of the film substrate, the second leads having a second length larger than the first length, first via plugs penetrating the film substrate and connected to first ends of the first leads, and second via plugs penetrating the film substrate and connected to first ends of the second leads, and first connection leads on a second surface of the film substrate facing the first surface, the first connection leads having first ends connected to the first via plugs, and second connection leads on the second surface of the film substrate, the second connection leads having first ends electrically connected to the second via plugs.

The COF package may further include a semiconductor chip on the first surface of the film substrate, the semiconductor chip being electrically connected to second ends of the first leads and second ends of the second leads.

The first ends of the first leads may be relatively close to the semiconductor chip, and the first ends of the second leads may be relatively far from the semiconductor chip.

The first via plugs may be relatively close to the semiconductor chip, and the second via plugs may be relatively far from the semiconductor chip.

The first connection leads may extend from the first via plugs to an opposite direction of the semiconductor chip. The second connection leads extend from the second via plugs toward the semiconductor chip.

The first connection leads and the second connection leads may be parallel to each other between the first via plugs and the second via plugs.

The first connection leads may extend to pass between the second via plugs. The second connection leads may extend to pass between the first via plugs.

The first leads and the second leads may be parallel to each other between the first via plugs and the second via plugs on the second surface of the film substrate.

The COF package may further include first pads at second ends of the first connection leads and second pads at second ends of the second connection leads.

The first connection leads or the second connection leads may have bending portions.

The first via plugs may form an imaginary first straight line. The second via plugs may form an imaginary second straight line. The first straight line and the second straight line may be parallel to each other Embodiments are also directed to a chip on film (COF) package including a film substrate, a semiconductor chip on a first surface of the film substrate, first leads on the first surface of the film substrate, the first leads extending from the semiconductor chip to a first length to have first ends, second leads on the first surface of the film substrate, the second leads extending from the semiconductor chip to a second length larger than the first length to have first ends, first via plugs penetrating the film substrate and connected to the first ends of the first leads, and second via plugs penetrating the film substrate and connected to the first ends of the second leads, first connection leads on a second surface of the film substrate facing the first surface, the first connection leads having first ends connected to the first via plugs, and second connection leads disposed on the first surface of the film substrate, the second connection leads being electrically connected to the first ends of the second leads.

The COF package may further include third connection leads on the second surface of the film substrate, the third connection leads being connected to the second via plugs.

The third connection leads may extend from the second via plugs toward the semiconductor chip.

The first connection leads and the third connection leads may be parallel to each other in a region between the first via plugs and the second via plugs on the second surface of the film substrate.

Embodiments are also directed to a film of a COF package including a film substrate, first leads on a first surface of the film substrate, the first leads extending from a semiconductor chip and having a first length, second leads on the first surface of the film substrate, the second leads extending from the semiconductor chip having a second length longer than the first length, first via plugs penetrating the film substrate and connected to first ends of the first leads, second via plugs penetrating the film substrate and connected to the second leads, and first connection leads on a second surface of the film substrate facing the first surface, the first connection leads having first ends connected to the first via plugs and second ends that form first pads on the second surface, the first connection leads extending from the first via plugs in a direction toward the semiconductor chip, and second connection leads on the second surface of the film substrate, the second connection leads having first ends electrically connected to the second via plugs and the second connection leads extending in an opposite direction from the semiconductor chip.

The second connection leads may include second ends that form second pads on the second surface.

Second leads may extend on the first surface from the semiconductor chip to beyond the second via plugs and terminate in second pads on the first surface.

BRIEF DESCRIPTION OF THE DRAWINGS

Features will become apparent to those of skill in the art by describing in detail exemplary embodiments with reference to the attached drawings in which.

DETAILED DESCRIPTION

Figure 1A:
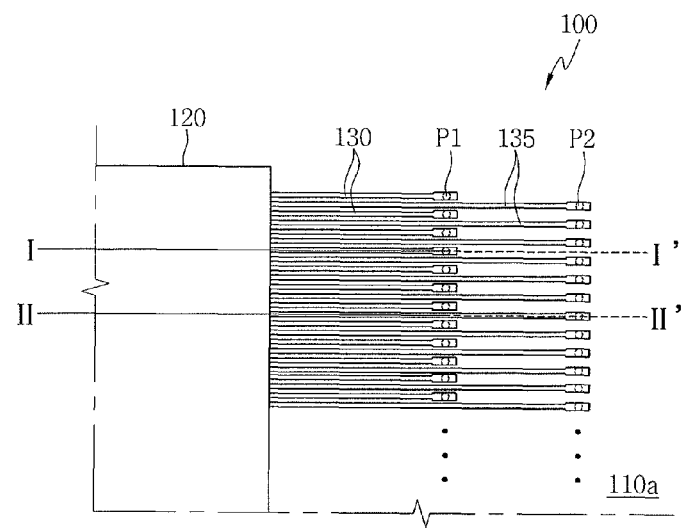
FIGS. 1A and 1B illustrate a top view and a bottom view depicting a COF package according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

Spatially relative terms (e.g., "beneath," "below," "lower," "above," "upper," "top," "bottom" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

In the disclosure, relative terms 'top' and 'bottom' are used as relative concepts to facilitate the understanding. Therefore, 'top' and 'bottom' do not designate a specific direction, position, or component and may be interchangeable. For example, 'top' may be interpreted as 'bottom' and 'bottom' may be interpreted as 'top'. However, 'top' and 'bottom' are not mixed with each other in one embodiment.

Figure 1B:
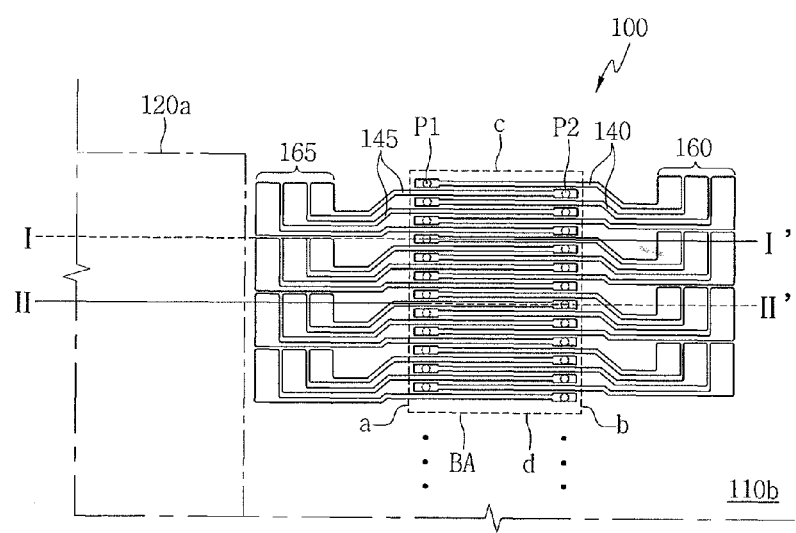
Figure 1C:
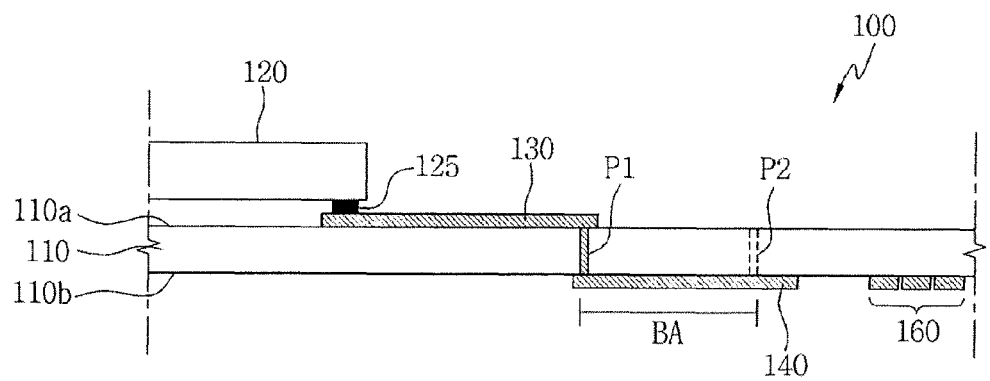
FIGS. 1C and 1D illustrate longitudinal cross-sectional views taken along solid line directions of I-I' and II-II' of FIGS. 1A and 1B.
Figure 1D:
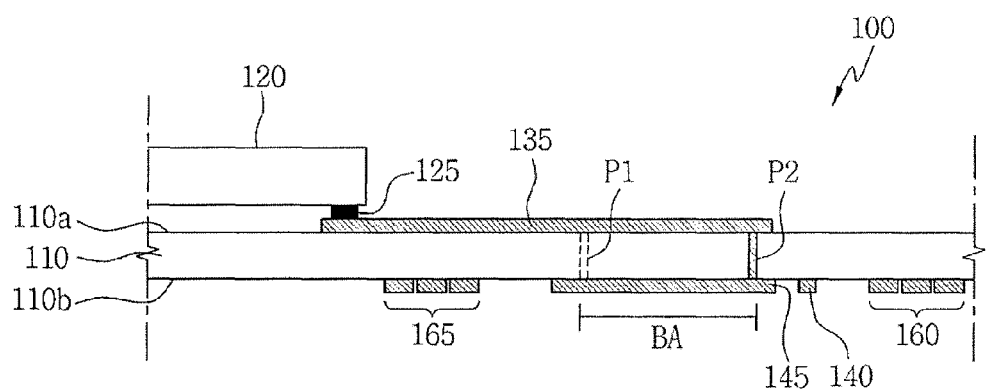

FIGS. 1A and 1B illustrate a top view and a bottom view depicting a COF package according to an embodiment, and FIGS. 1C and 1D illustrate longitudinal cross-sectional views taken along solid line directions of I-I' and II-II' of FIGS. 1A and 1B.

Referring to FIGS. 1A and 1B, a COF package 100 according to this embodiment may include a film substrate 110 (see FIGS. 1C and 1D), a semiconductor chip 120, first and second leads 130 and 135 having different lengths from each other, first and second connection leads 140 and 145, and first and second pads 160 and 165. First via plugs P1 connected to the first leads 130 and penetrating the film substrate 110, and second via plugs P2 connected to the second leads 135 and penetrating the film substrate 110 may be formed in the film substrate 110. The first via plugs P1 may be disposed relatively close to the semiconductor chip 120, and the second via plugs P2 may be disposed relatively far from the semiconductor chip 120.

The film substrate 110 may be formed of, for example, a resin-based material, such as polyimide or polyester, and may have flexibility.

Referring to FIG. 1A, the first leads 130 may be formed on a first surface 110a of the film substrate 110 to have a relatively short length from the semiconductor chip 120. One end of the first leads 130 may be connected to the semiconductor chip 120, and the other end thereof may be connected to the first via plugs P1.

The second leads 135 may be formed on the first surface 110a of the film substrate 110 to have a relatively long length from the semiconductor chip 120. One end of the second leads 135 may be connected to the semiconductor chip 120, and the other end thereof may be connected to the second via plugs P2.

The semiconductor chip 120 may be formed on the first and second leads 130 and 135 to be electrically connected thereto. The semiconductor chip 120 may be electrically connected to the first and second leads 130 and 135 through bumps 125 (see FIGS. 1C and 1D) disposed on the first and second leads 130 and 135, respectively. The other end of the first leads 130 may be disposed closer to the semiconductor chip 120 than the other end of the second leads 135. The first via plugs P1 may be disposed relatively closer to the semiconductor chip 120, and the second via plugs P2 may be disposed relatively farther way from the semiconductor chip 120.

Referring to FIG. 1B, the first pads 160 may be formed on a second surface 110b of the film substrate 110 to correspond on a one-to-one basis to the first leads 130 and to be electrically connected to the first leads 130.

The second pads 165 may be formed on the second surface 110b of the film substrate 110 to correspond on a one-to-one basis to the second leads 135 and to be electrically connected to the second leads 135. For clarity, in FIG. 1B, a portion in which the semiconductor chip 120 is located is indicated by an imaginary line 120a.

The first connection leads 140 may have one end connected to the first via plugs P1, and the other end connected to the first pads 160. The second connection leads 145 may have one end connected to the second via plugs P2, and the other end connected to the second pads 165. The first connection leads 140 may extend from the first via plugs P1 to an opposite direction from the semiconductor chip 120, and the second connection leads 145 may extend from the second via plugs P2 toward the semiconductor chip 120. The first connection leads 140 may pass between the second via plugs P2, and the second connection leads 145 may pass between the first via plugs P1.

The first via plugs P1 may be disposed to form an imaginary straight line, and the second via plugs P2 may be also disposed to form an imaginary straight line. The imaginary straight line of the first via plugs P1 may be parallel to the imaginary straight line of the second via plugs P2. A bonding area BA may be defined between the first via plugs P1 and the second via plugs P2 on the second surface 110b of the film substrate 110. For example, the bonding area BA may be defined in a tetragonal shape having four sides a, b, c, and d. The first connection leads 140 and the second connection leads 145 may be parallel to each other in the bonding area BA.

In this embodiment, the first and second pads 160 and 165 may be disposed to be distributed around two imaginary facing sides a and b of the bonding area BA, respectively. The first pads 160 may be disposed around a first side a of the bonding area BA (for example, to the right of the bonding area BA in FIGS. 1B and 1C), and the second pads 165 may be disposed around a second side b of the bonding area BA (for example, to the left of the bonding area BA in FIGS. 1B and 1C). The number of the first pads 160 may be symmetrically equal to or asymmetrically larger or smaller than the number of the second pads 165 depending on the number of first and second leads 130 and 135. For example, pads corresponding to one half the number of total leads may be disposed in the left of the bonding area BA, and pads corresponding to the other half the number of the total leads may be disposed in the right of the bonding area BA. In other implementations, the number of the pads disposed at any one side of the bonding area BA may be asymmetrically larger or smaller than the number of pads disposed at another side of the bonding area BA. In FIGS. 1A and 1B, it is assumed that facing two sides of the bonding area BA are the first side a and the second side b, but the first and second pads 160 and 165 may be disposed to be distributed around a third side c and a fourth side d which are other facing sides of the bonding area BA.

The bonding area BA is an area where one end of the COF package 100 is directly bonded to one end of an external circuit to be described below. A signal output from the COF package 100 may be transferred to the external circuit through the bonding. The bonding area BA may be defined as an area including an area of the first and second via plugs P1 and P2 and an area between the first and second via plugs P1 and P2.

Referring to FIGS. 1B and 1C, the first connection lead 140 may be formed on the second surface 110b of the film substrate 110, and may electrically connect the first via plug P1 and the first pad 160. One end of the first connection lead 140 may be connected to the first via plug P1, and the other end thereof may cross the bonding area BA and be connected to the first pad 160. Although it may appear in FIG. 1C (a cross-sectional view) that the first connection lead 140 is separated from the first pad 160, the first connection lead 140 is actually connected to the first pad 160, as illustrated in FIG. 1B (a bottom view). The first lead 130 may be electrically connected to the first pad 160 through the first via plug P1 and the first connection lead 140. The first connection lead 140 and the first pad 160 may be formed to be unified such that the first connection lead 140 is materially in continuity, or integral, with the first pad 160.

Referring to FIG. 1D, the second connection lead 145 may be formed on the second surface 110b of the film substrate 110, and may electrically connect the second via plug P2 and the second pad 165. One end of the second connection lead 145 may be connected to the second via plug P2, and the other end thereof may cross the bonding area BA and be connected to the second pad 165. Although it may appear in FIG. 1D (a cross-sectional view) that the second connection lead 145 is separated from the second pad 165, the second connection lead 145 is actually connected to the second pad 165, as illustrated in FIG. 1B (a bottom view). The second lead 135 may be electrically connected to the second pad 165 through the second via plug P2 and the second connection lead 145. The second connection lead 145 and the second pad 165 may be formed to be unified so that the second connection lead 145 is materially in continuity, or integral, with the second pad 165.

For example, the first and second leads 130 and 135 formed on the first surface 110a of the film substrate 110 may be electrically connected to the first and second pads 160 and 165 formed on the second surface 110b of the film substrate 110 through corresponding via plugs P1 and P2 and corresponding connection leads 140 and 145, respectively. Therefore, a test for each of the leads may be performed by probing each of the pads corresponding to respective ones of the leads using a predetermined test apparatus.

There may be both the first connection lead 140 electrically connected to the first lead 130 and the second connection lead 145 electrically connected to the second lead 135 in the bonding area BA. When the first and second leads 130 and 135 are bonded to an external circuit to be described below, the first lead 130 may be electrically connected to the external circuit through the first via plug P1 and the first connection lead 140, and the second lead 135 may be electrically connected to the external circuit through the second via plug P2 and the second connection lead 145. When the first and second leads 130 and 135 are tested, or bonded to the external circuit, both the first and second leads 130 and 135 may be connected to corresponding pads 160 and 165 or the external circuit through corresponding first and second connection leads 140 and 145 in the bonding area BA.

Figure 1E:
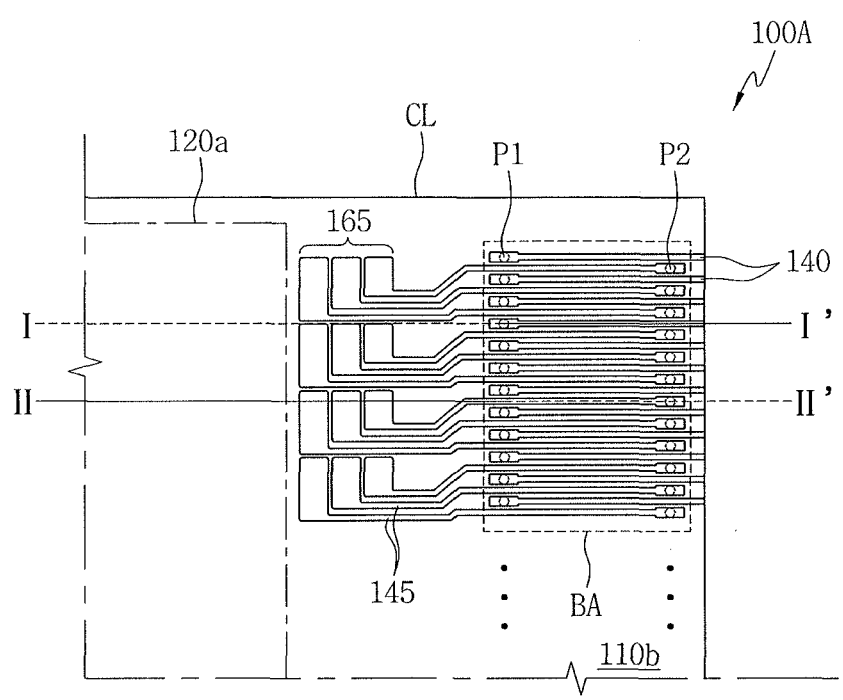
FIG. 1E illustrates a bottom view depicting a cut COF package according to the embodiment.
Figure 1F:
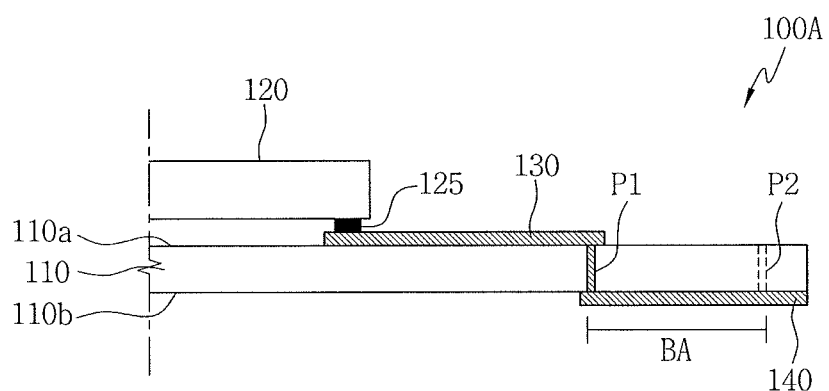
FIGS. 1F and 1G illustrate longitudinal cross-sectional views taken along solid line directions of I-I' and II-II' of FIGS. 1A and 1E.
Figure 1G:
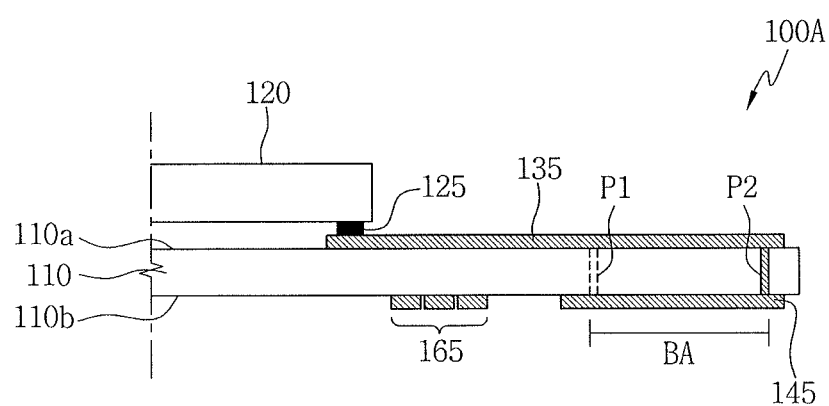

FIG. 1E illustrates a bottom view depicting a cut COF package according to this embodiment, and FIGS. 1F and 1G illustrate longitudinal cross-sectional views taken along solid line directions of I-I' and II-II' of FIGS. 1A and 1E.

Referring to FIGS. 1E to 1G, in a cut COF package 100A according to this embodiment, after the test of the first and second leads 130 and 135 is completed, a no longer needed portion of the COF package may be cut along a cutting line CL according to a standard of the COF package or for a subsequent process (for example, a bonding process to an external circuit).

As illustrated in FIG. 1F, in the cut COF package 100A, the first pad 160 formed on the second surface 110b of the film substrate 110 may be cut, whereas as illustrated in FIG. 1G, the second pad 165 disposed between the semiconductor chip 120 and the bonding area BA and a portion of the second connection lead 145 in an area other than the bonding area BA may be not cut but may remain. At this time, the second pad 165 and the second connection lead 145 partially left in the area other than the bonding area BA are no longer needed after the test is completed. There is a risk that the second pad 165 and the second connection lead 145 could contact various interconnections or circuits formed in the external circuit to be short-circuited or to electrically affect the external circuit when bonding the cut COF package to the external circuit to be described later. Therefore, to prevent or reduce the likelihood of such a short-circuit or electrical effect, an insulating layer may be formed on the second pad 165 and the left second connection lead 145. The insulating layer will be described in detail below with reference to FIGS. 5A and 5B.

Figure 2A:
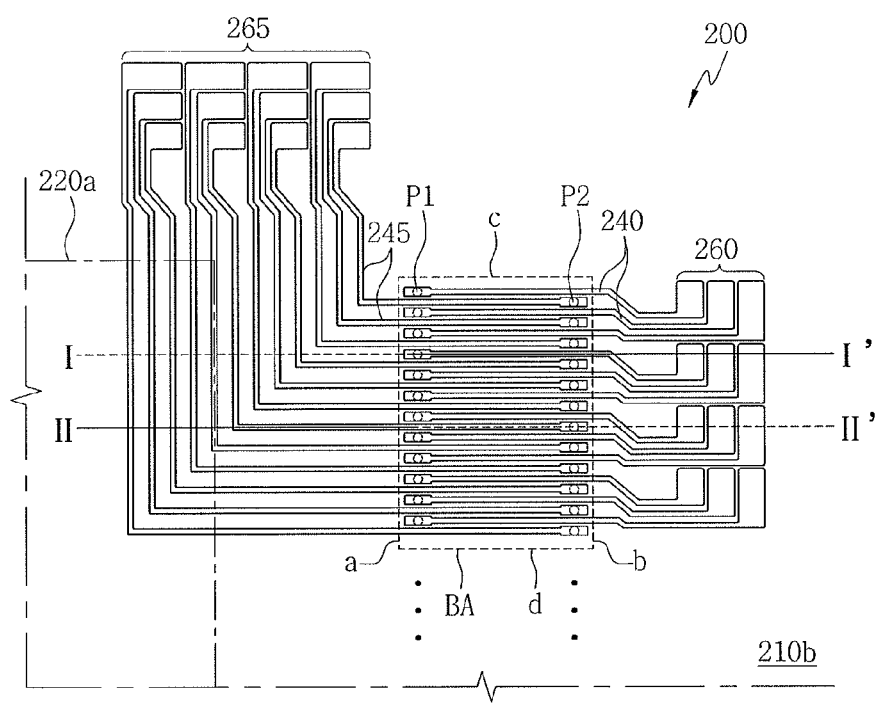
FIG. 2A illustrates a bottom view depicting a COF package according to another embodiment.
Figure 2B:
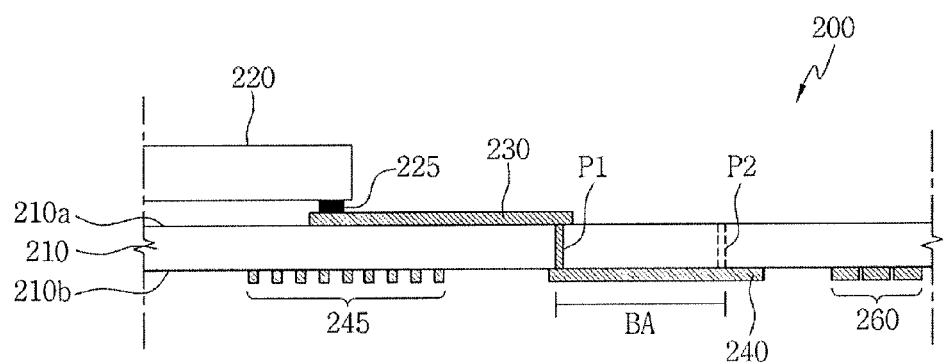
FIGS. 2B and 2C illustrate longitudinal cross-sectional views taken along solid line directions of I-I' and II-II' of FIGS. 1A and 2A.
Figure 2C:
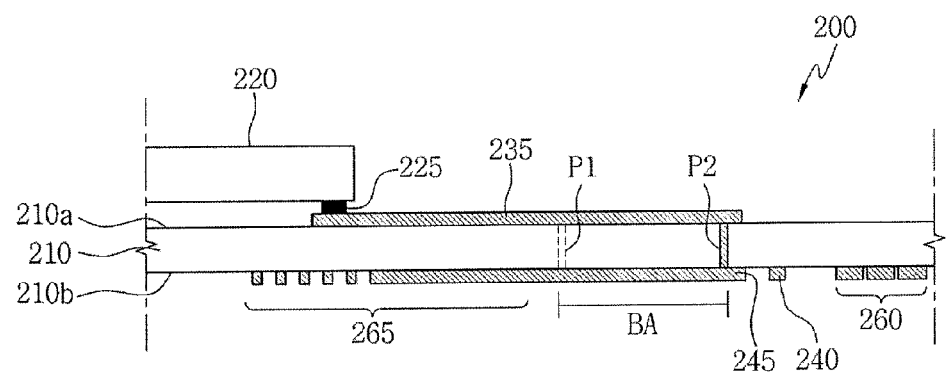

FIG. 2A illustrates a bottom view depicting a COF package according to another embodiment, and FIGS. 2B and 2C illustrate longitudinal cross-sectional views taken along solid line directions of I-I' and II-II' of FIGS. 1A and 2A. A COF package 200 according to this embodiment is the same as the COF package 100 according to the embodiment illustrated in FIGS. 1A-1G, except for an arrangement of a second pad 265 and a second connection lead 245. Thus, a detailed description of components of the COF package that are the same as those of the COF package 100 will not be repeated. Further, a top view of the COF package 200 according to this embodiment is the same as that of the COF package 100 in FIG. 1A. Accordingly, the top view of the COF package 200 may be understood with reference to the top view illustrated in FIG. 1A.

Referring to FIGS. 1A and 2A to 2C, the COF package 200 according to this embodiment may include a film substrate 210, a semiconductor chip 220, first and second leads 230 and 235 having different lengths from each other, first and second connection leads 240 and 245, and first and second pads 260 and 265. A first via plug P1 connected to the first lead 230 and penetrating the film substrate 210, and a second via plug P2 connected to the second lead 235 and penetrating the film substrate 210 may be formed in the film substrate 210. Here, the first via plug P1 may be disposed relatively close to the semiconductor chip 220, and the second via plug P2 may be disposed relatively far from the semiconductor chip 220.

Referring to FIG. 2A, the first pad 260 may be formed on a second surface 210b of the film substrate 210 to correspond on a one-to-one basis with the first lead 230 and to be electrically connected to the first lead 230.

The second pad 265 may be formed on the second surface 210b of the film substrate 210 to correspond on a one-to one basis with the second lead 235 and to be electrically connected to the second lead 235.

In this embodiment, the first and second pads 260 and 265 may be disposed to be distributed around adjacent two imaginary sides b and c of a bonding area BA, respectively. The first pad 260 may be disposed around a second side b of the bonding area BA (for example, around the right of the bonding area BA in FIG. 2A), and the second pad 265 may be disposed around a third side c of the bonding area BA (for example, around a top of the bonding area BA in FIG. 2A). The number of the first pads 260 may be symmetrically equal to or asymmetrically larger or smaller than the number of the second pads 265 depending on the number of first and second leads 230 and 235. Pads corresponding to one half the number of total leads may be disposed in the left of the bonding area BA, and the other half the number of the total leads may be disposed in the top of the bonding area BA. In other implementations, the number of pads disposed at one side of the bonding area BA may be asymmetrically larger or smaller than the number of pads disposed at the other side of the bonding area BA. In FIG. 2A, it is shown that adjacent two sides of the bonding area BA are the second side b and the third side c of the bonding area BA. In other implementations, the first and second pads 260 and 265 may be disposed to be distributed around a first side a and a fourth side d, which are other adjacent two sides of the bonding area BA.

Referring to FIG. 2B, the first connection lead 240 may be formed on the second surface 210b of the film substrate 210, and electrically connect the first via plug P1 and the first pad 260. One end of the first connection lead 240 may be connected to the first via plug P1, and the other end thereof may cross the bonding area BA and be connected to the first pad 260. Although it may appear in FIG. 2B (a cross-sectional view) that the first connection lead 240 is separated from the first pad 260, the first connection lead 240 is actually substantially connected to the first pad 260, as illustrated in FIG. 2A (a bottom view). Therefore, the first lead 230 may be electrically connected to the first pad 260 through the first via plug P1 and the first connection lead 240. The first connection lead 240 and the first pad 260 may be formed to be unified so that the first connection lead 240 is materially in continuity, or integral, with the first pad 260.

Referring to FIG. 2C, the second connection lead 245 may be formed on the second surface 210b of the film substrate 210, and may electrically connect the second via plug P2 and the second pad 265. One end of the second connection lead 245 may be connected to the second via plug P2, and the other end thereof may cross the bonding area BA and be connected to the second pad 265. Although it may appear in FIG. 2C (a cross-sectional view) that the second connection lead 245 is separated from the second pad 265, the second connection lead 245 is actually connected to the second pad 265, as illustrated in FIG. 2A (a bottom view). As illustrated in FIG. 2A, the second connection lead 245 may have at least one bending portion in which a portion of the second connection lead 245 is bent at a predetermined angle (for example, 90 degrees). Therefore, the second lead 235 may be electrically connected to the second pad 265 through the second via plug P2 and the second connection lead 245. The second connection lead 245 and the second pad 265 may be formed to be unified so that the second connection lead 245 is materially in continuity, or integral, with the second pad 265.

For example, the first and second leads 230 and 235 formed on a first surface 210a of the film substrate 210 may be electrically connected to the first and second pads 260 and 265 formed on the second surface 210b of the film substrate 210 through corresponding via plugs P1 and P2 and corresponding connection leads 240 and 245. Therefore, a test for each of the leads may be performed by probing each of the pads corresponding to each of the leads using a predetermined test apparatus.

Like the COF package 100 according to the previous embodiment, there may be both the first connection lead 240 electrically connected to the first lead 230 and the second connection lead 245 electrically connected to the second lead 235 in the bonding area BA. When the first and second leads 230 and 235 are bonded to an external circuit to be described below, the first lead 230 may be electrically connected to the external circuit through the first via plug P1 and the first connection lead 240, and the second lead 235 may be electrically connected to the external circuit through the second via plug P2 and the second connection lead 245. When the first and second leads 230 and 235 are tested, or bonded to the external circuit, both the first and second leads 230 and 235 may be connected to corresponding pads or the external circuit through corresponding first and second connection leads 240 and 245 in the bonding area BA.

Figure 2D:
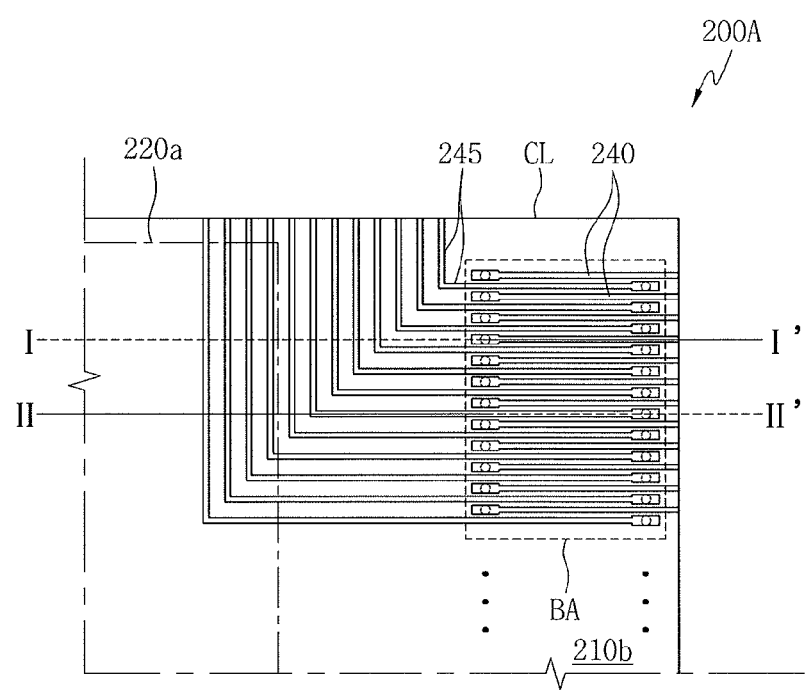
FIG. 2D illustrates a bottom view depicting a cut COF package according to this embodiment.
Figure 2E:
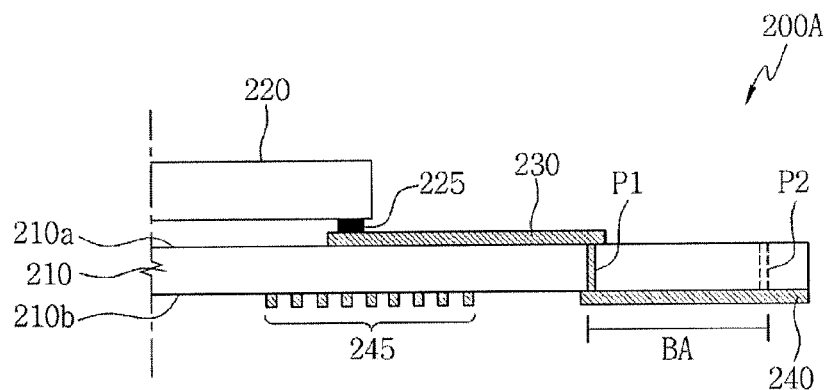
FIGS. 2E and 2F illustrate longitudinal cross-sectional views taken along solid line directions of I-I' and II-II' of FIGS. 1A and 2D.
Figure 2F:
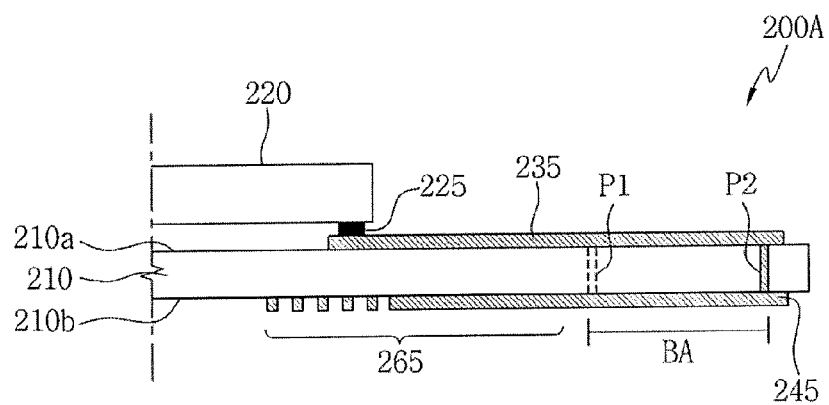

FIG. 2D illustrates a bottom view depicting a cut COF package according to this embodiment, and FIGS. 2E and 2F illustrate longitudinal cross-sectional views taken along solid line directions of I-I' and II-II' of FIGS. 1A and 2D.

Referring to FIGS. 2D to 2F, in a cut COF package 200A according to this embodiment, after the test of the first and second leads 230 and 235 is completed, a no longer needed portion of the COF package may be cut along a cutting line CL according to a standard of the COF package or for a subsequent process (for example, a bonding process to an external circuit).

In the embodiment, as illustrated in FIG. 2D, in the cut COF package 200A, both the first and second pads 260 and 265 formed on the second surface 210b of the film substrate 210 may be cut, whereas the second connection lead 245 may be still left in an area other than the bonding area BA. Like the previous embodiment as described above, the second connection lead 245 partially left in the area other than the bonding area BA is no longer needed after the test is completed. There may be a risk that the leftover portion of the second connection lead could contact various interconnections or circuits formed in the external circuit to be short-circuited or to electrically affect the external circuit when bonding to the external circuit to be described below. To prevent or reduce the likelihood of such a short-circuit or electrical effect, an insulating layer may be formed on the second connection lead 245. The insulating layer will be described in detail below with reference to FIGS. 5A and 5B.

Figure 3A:
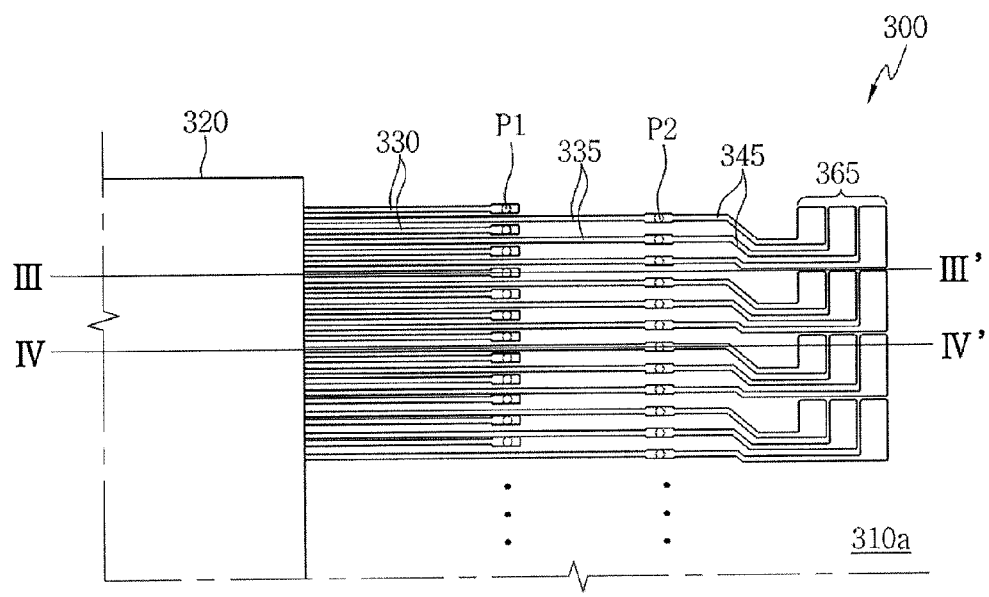
FIGS. 3A and 3B illustrate a top view and a bottom view depicting a COF package according to a another embodiment.
Figure 3B:
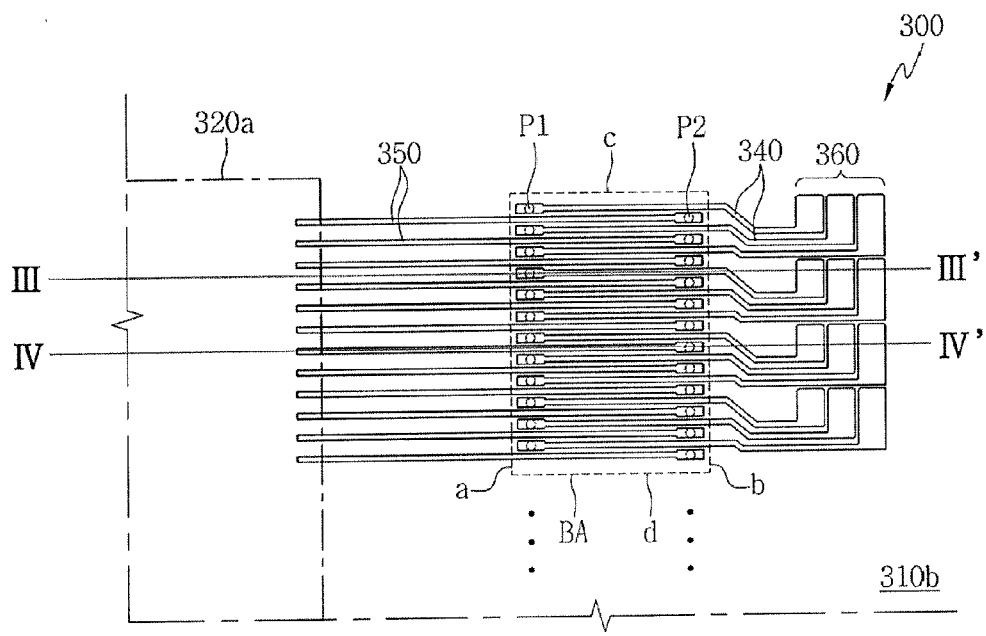
Figure 3C:
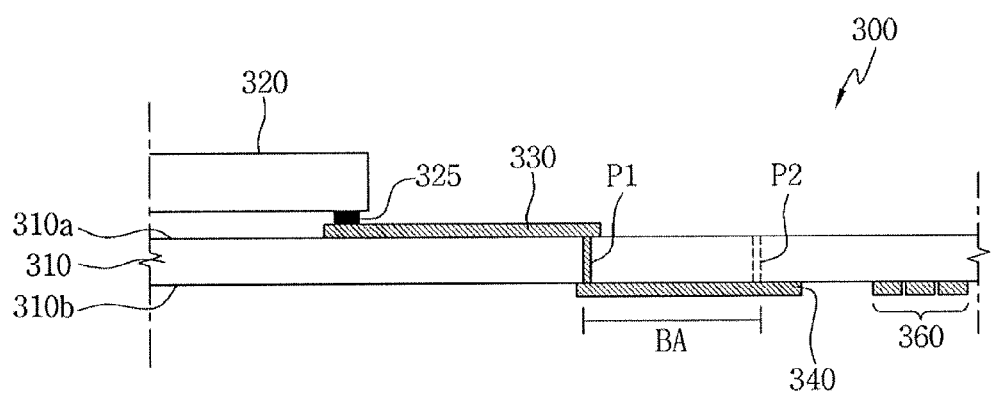
FIGS. 3C and 3D illustrate longitudinal cross-sectional views taken along solid line directions of III-III' and IV-IV' of FIGS. 3A and 3B.
Figure 3D:
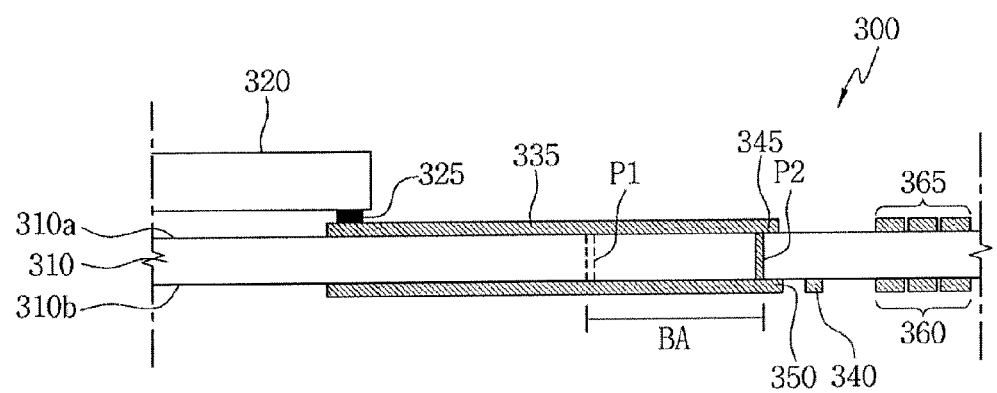

FIGS. 3A and 3B illustrate a top view and a bottom view depicting a COF package according to another embodiment, and FIGS. 3C and 3D illustrate longitudinal cross-sectional views taken along solid line directions of III-III' and IV-IV' of FIGS. 3A and 3B.

Referring to FIGS. 3A to 3D, a COF package 300 according to this embodiment may include a film substrate 310, a semiconductor chip 320, first and second leads 330 and 335 having different lengths from each other, first to third connection leads 340, 345, and 350, and first and second pads 360 and 365. A first via plug P1 connected to the first lead 330 and penetrating the film substrate 310, and a second via plug P2 connected to the second lead 335 and penetrating the film substrate 310 may be formed in the film substrate 310. The first via plug P1 may be disposed relatively close to the semiconductor chip 320, and the second via plug P2 may be disposed relatively far from the semiconductor chip 320.

Referring to FIG. 3A, the first lead 330 may be formed on a first surface 310a of the film substrate 310 to have a relatively short length from the semiconductor chip 320. One end of the first lead 330 may be connected to the semiconductor chip 320, and the other end thereof may be connected to the first via plug P1.

The second lead 335 may be formed on the first surface 310a of the film substrate 310 to have a relatively long length from the semiconductor chip 320. One end of the second lead 335 may be connected to the semiconductor chip 320, and the other end thereof may be connected to the second via plug P2.

The semiconductor chip 320 may be formed on the first and second leads 330 and 335. The semiconductor chip 320 may be electrically connected to the first and second leads 330 and 335 through bumps 325 disposed on the first and second leads 330 and 335, respectively.

Referring to FIG. 3B, first pads 360 may be formed on a second surface 310b of the film substrate 310 to correspond on a one-to-one basis to first leads 330 and to be electrically connected to the first leads 330.

Referring back to FIG. 3A, second pads 365 may be formed on the first surface 310a of the film substrate 310 to correspond on a one-to-one basis to second leads 335 and to be electrically connected to the second leads 335.

In the embodiment, as described above, the first and second pads 360 and 365 may be disposed on the first surface 310a and the second surface 310b of the film substrate 310, respectively. For example, the first pad 360 may be disposed on the second surface 310b of the film substrate 310, and the second pad 365 may be disposed on the first surface 310a of the film substrate 310.

In FIGS. 3A to 3D, both the first and second pads 360 and 365 are shown to be formed in the right of the bonding area BA. In other implementations, the first and second pads 360 and 365 may be disposed to be distributed at least imaginary two sides or more of the bonding area BA. The number of the first pads 360 may be symmetrically equal to or asymmetrically larger or smaller than the number of the second pads 365 depending on the number of first and second leads 330 and 335. Pads corresponding to one half the number of total leads may be disposed at any one side of first to fourth sides a, b, c, and d of the bonding area BA, and the other half the number of the total leads may be disposed at another side of the first to fourth sides a, b, c, and d of the bonding area BA. The number of pads disposed at the one side of the bonding area BA may be larger or smaller than the number of the pads disposed at the other side of the bonding area BA such that the pads may be asymmetrically disposed.

Referring to FIG. 3C, the first connection lead 340 may be formed on the second surface 310b of the film substrate 310, and may electrically connect the first via plug P1 and the first pad 360. One end of the first connection lead 340 may be connected to the first via plug P1, and the other end thereof may cross the bonding area BA and be connected to the first pad 360. Although it appears in FIG. 3C (a cross-sectional view) that the first connection lead 340 is separated from the first pad 360, the first connection lead 340 is actually connected to the first pad 360, as illustrated in FIG. 3B (a bottom view). The first lead 330 may be electrically connected to the first pad 360 through the first via plug P1 and the first connection lead 340. The first connection lead 340 and the first pad 360 may be formed to be unified so that the first connection lead 340 is materially in continuity, or integral, with the first pad 360.

Referring to FIG. 3D, the second connection lead 345 may be formed on the first surface 310a of the film substrate 310, and may electrically connect the second lead 335 and the second pad 365. One end of the second connection lead 345 may be connected to the second lead 335, and the other end thereof may be connected to the second pad 365. Although it appears in FIG. 3D (a cross-sectional view) that the second connection lead 345 is separated from the second pad 365, the second connection lead 345 is actually connected to the second pad 365, as illustrated in FIG. 3A (a top view). The second lead 335 may be electrically connected to the second pad 365 through the second connection lead 345. The second connection lead 345 and the second pad 365 may be formed to be unified so that the second connection lead 345 may be materially in continuity, or integral, with the second pad 365. Further, the second lead 335 and the second connection lead 345 may be formed to be unified so that the second lead 335 may be materially in continuity, or integral, with the second connection lead 345.

The first lead 330 formed on the first surface 310a of the film substrate 310 may be electrically connected to the first pad 360 formed on the second surface 310b of the film substrate 310 through the first via plug P1. The second lead 335 formed on the first surface 310a of the film substrate 310 may be electrically connected to the second pad 365 through the second connection lead 345 formed on the first surface 310a of the film substrate 310. A test for each of the leads may be performed by probing each of the pads corresponding to each of the leads using a predetermined test apparatus.

The third connection lead 350 may formed on the second surface 310b of the film substrate 310 to be connected to the second via plug P2 and to cross the bonding area BA. The third connection lead 350 may be formed such that one end of the third connection lead 350 is connected to the second via plug P2, and the other end thereof crosses the bonding area BA to be directed toward the semiconductor chip 320. The second lead 335 may be electrically connected to the third connection lead 350 through the second via plug P2.

There may be both the first connection lead 340 electrically connected to the first lead 330 and the third connection lead 350 electrically connected to the second lead 335 in the bonding area BA. Therefore, when the first and second leads 330 and 335 are bonded to an external circuit to be described below, the first lead 330 may be electrically connected to the external circuit through the first via plug P1 and the first connection lead 340, and the second lead 335 may be electrically connected to the external circuit through the second via plug P2 and the third connection lead 350. The first lead 330 may be connected to the external circuit through the first connection lead 340 in the bonding area BA when the first lead 330 are tested or bonded to the external circuit. The second lead 335 may be connected to the second pad 365 through the second connection lead 345 when the second lead 335 is tested and to the external circuit through the third connection lead 350 when the second lead 335 are bonded to the external circuit after the test is completed.

Figure 3E:
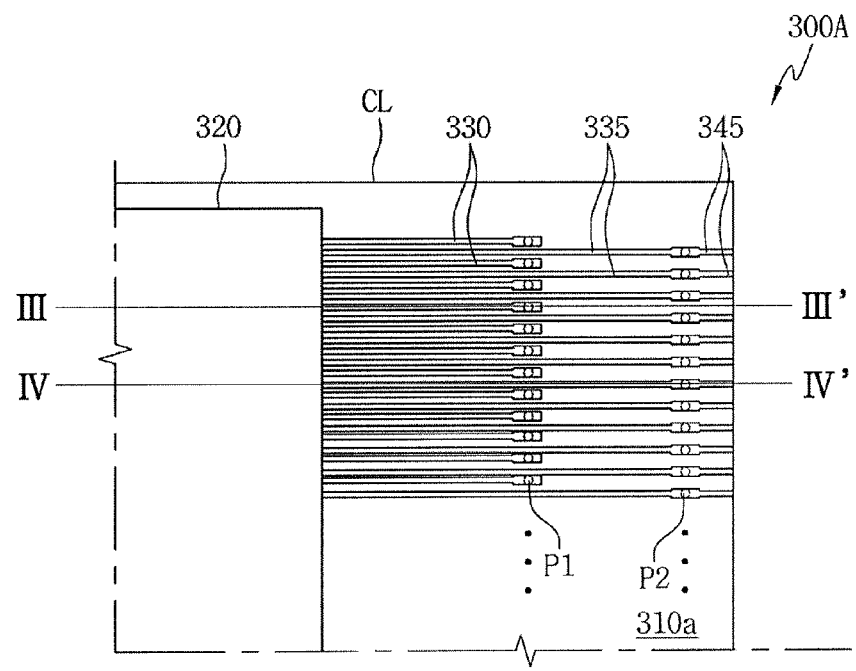
FIGS. 3E and 3F illustrate a top view and a bottom view depicting a cut COF package according to this embodiment.
Figure 3F:
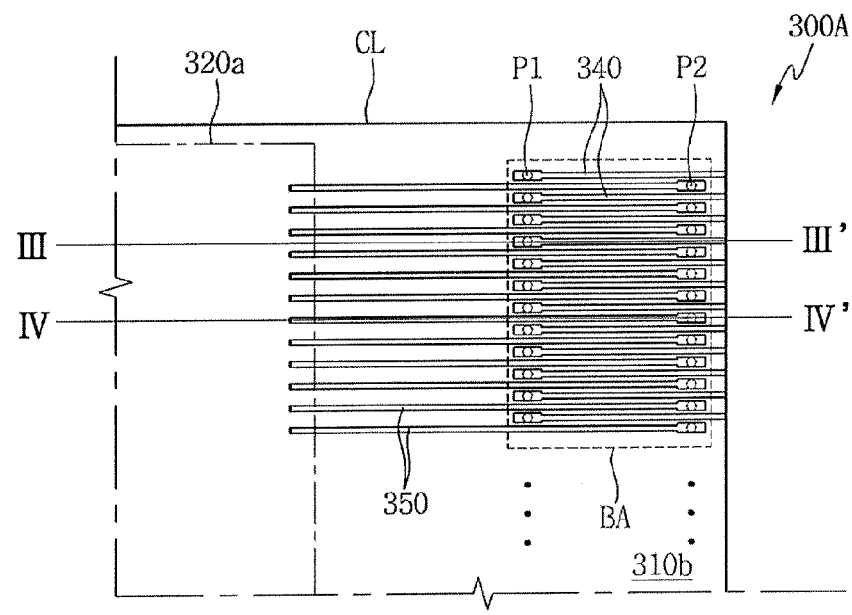
Figure 3G:
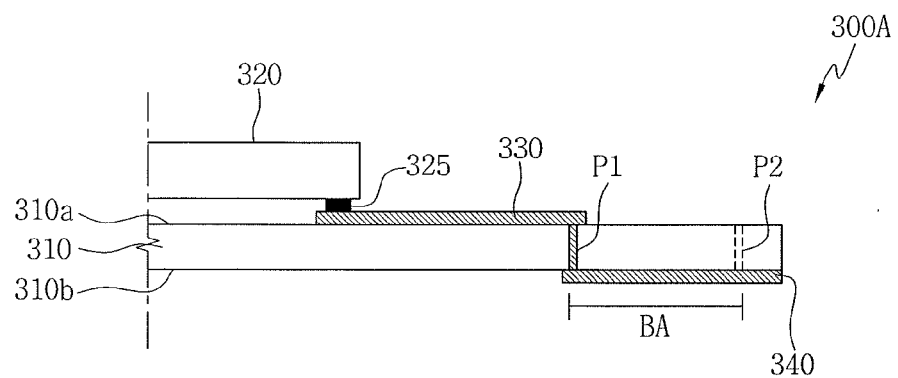
FIGS. 3G and 3H illustrate longitudinal cross-sectional views taken along solid line directions of III-III' and IV-IV' of FIGS. 3E and 3F.
Figure 3H:
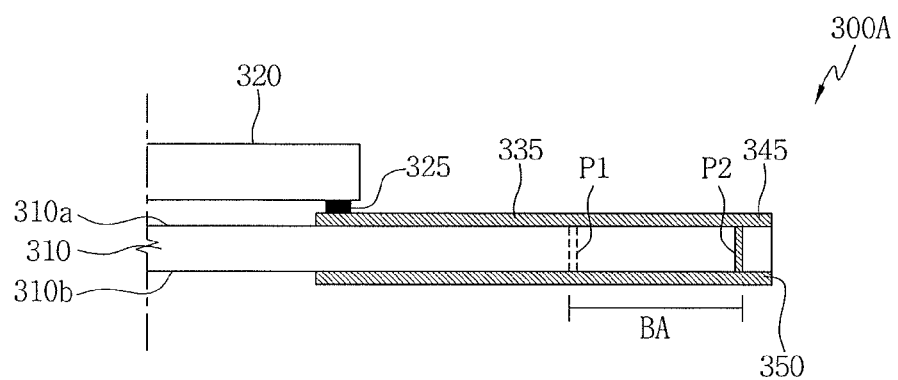

FIGS. 3E and 3F illustrate a top view and a bottom view depicting a cut COF package according to this embodiment, and FIGS. 3G and 3H illustrate longitudinal cross-sectional views taken along solid line directions of III-III' and IV-IV' of FIGS. 3E and 3F.

Referring to FIGS. 3E to 3H, in a cut COF package 300A according to this embodiment, after the test of the first and second leads 330 and 335 is completed, a no longer needed portion of the COF package may be cut along a cutting line CL according to a standard of the COF package or for a subsequent process (for example, a bonding process to an external circuit).

In the embodiment, as illustrated in FIGS. 3E and 3G, of the cut COF package 300A, the first pad 360 formed on the second surface 310b of the film substrate 310 may be cut, and as illustrated in FIGS. 3F and 3H, the second pad 365 formed on the first surface 310a of the film substrate 310 may be also cut.

When all the first and second pads 360 and 365, and the first and second connection leads 340 and 345 are cut and are not left on the film substrate 310 other than the bonding area BA, the process of forming the insulating layer mentioned with respect to embodiments of FIGS. 1A to 1g and 2A to 2F may be omitted.

Figure 4A:
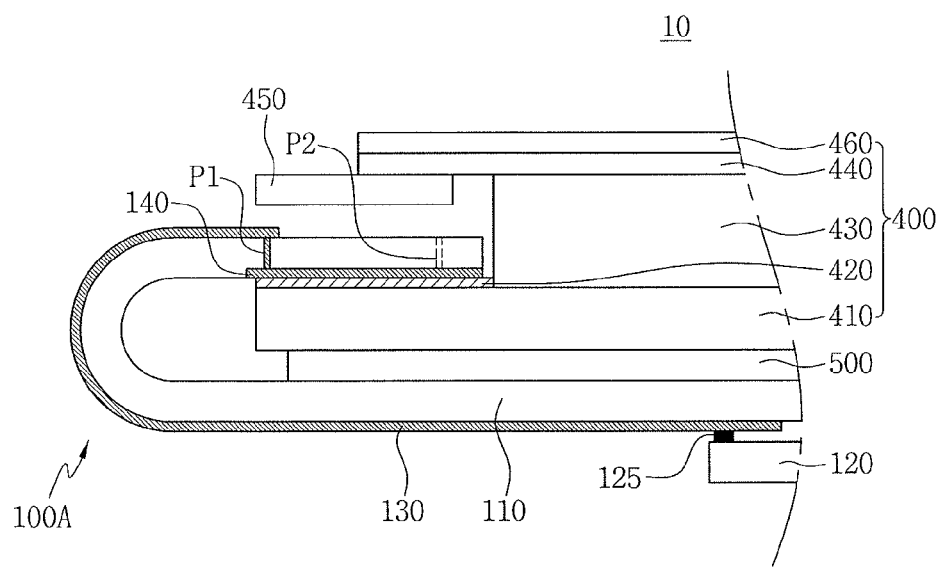
FIGS. 4A and 4B illustrate coupling cross-sectional views depicting one end of an apparatus assembly according to the embodiment illustrated in FIGS. 1A-1G.
Figure 4B:
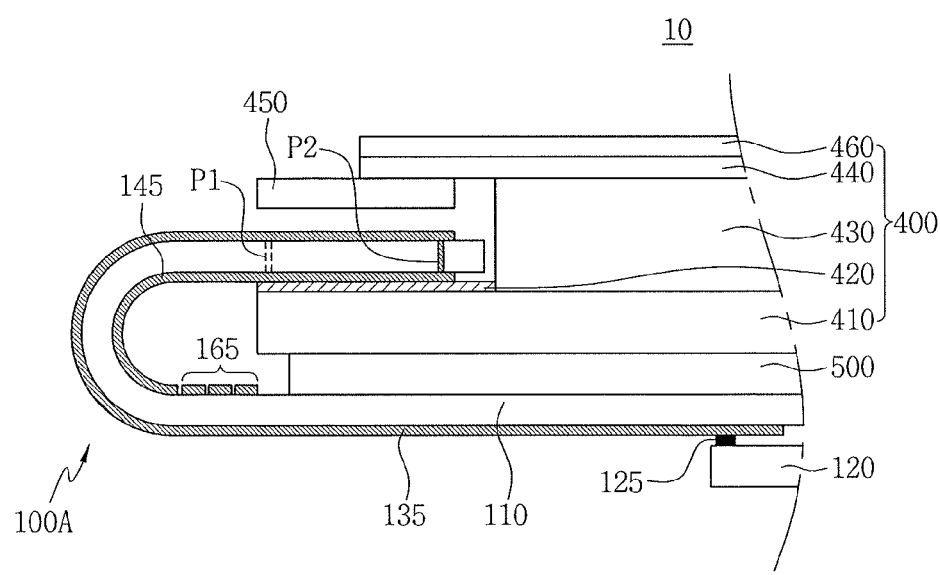

FIGS. 4A and 4B illustrate coupling cross-sectional views depicting one end of an apparatus assembly according to an embodiment. FIGS. 4A and 4B schematically illustrate one end of an apparatus assembly 10 in which the COF package 100 and 100A described with reference to FIGS. 1A to 1G and an external circuit, for example, a panel unit 400, are bonded. In the embodiment, the apparatus assembly 10 may be a display apparatus.

Referring to FIGS. 4A and 4B, the panel unit 400 may include a panel substrate 410. The panel unit 400 may further include an interconnection 420 formed on the panel substrate 410 to receive an signal provided from the cut COF package 100A, a display panel 430 formed on the panel substrate 410 to display a screen image, a touch panel 440 formed on the display panel 430, and a touch driver 450 configured to drive the touch panel 440. Further, the panel unit 400 may further include a protection layer 460 disposed on the touch panel 440 to protect the pouch panel 440.

After a test for the cut COF package 100A according to the embodiment illustrated in FIGS. 1A to 1G is completed, a subsequent process of bonding one end of the cut COF package 100A to one end of the panel unit 400 may be performed.

Referring to FIG. 4A, a first connection lead 140 of the cut COF package 100A according to the embodiment illustrated in FIGS. 1A to 1G and the interconnection 420 of the panel unit 400 may be directly bonded to each other. A first lead 130 may be electrically connected to the interconnection 420 of the panel unit 400 through a first via plug P1 and the first connection lead 140.

Referring to FIG. 4B, a second connection lead 145 of the cut COF package 100A according to the embodiment illustrated FIGS. 1A to 1G and the interconnection 420 of the panel unit 400 may be directly bonded to each other. A second lead 135 may be electrically connected to the interconnection 420 of the panel unit 400 through a second via plug P2 and the second connection lead 145.

After the one end of the cut COF package 100A according to the embodiment illustrated in FIGS. 1A to 1G is bonded to the one end of the panel unit 400 as illustrated in FIGS.

4A and 4B, the other end of the cut COF package 100A may be bent to be disposed in a bottom of the panel unit 400 (for example, a bottom of the panel substrate 410). The bent film substrate 110 and the panel substrate 410 may be adhered to each other through a predetermined adhesive 500.

Figure 5A:
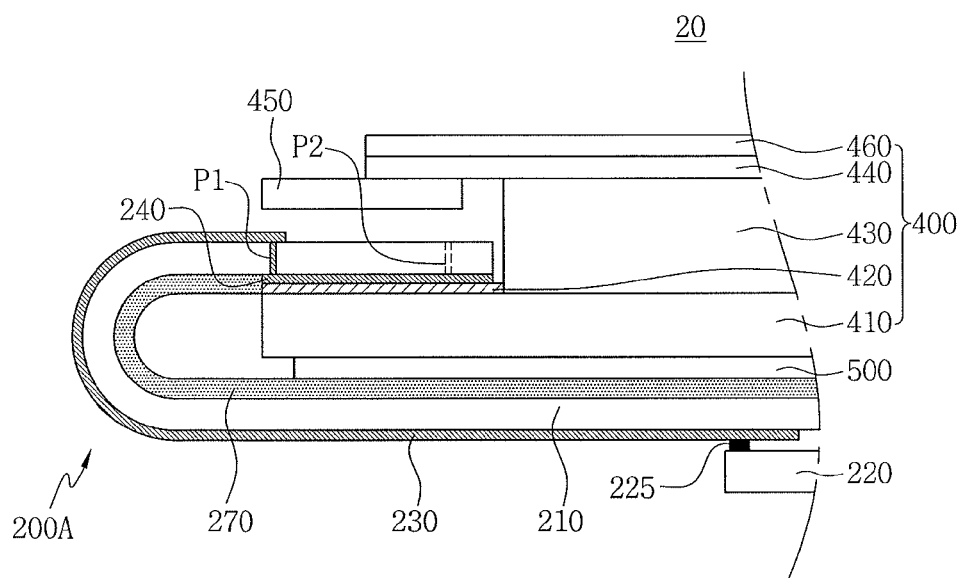
FIGS. 5A and 5B illustrate coupling cross-sectional views depicting one end of an apparatus assembly according to the embodiment illustrated in FIGS. 2A-2C.
Figure 5B:
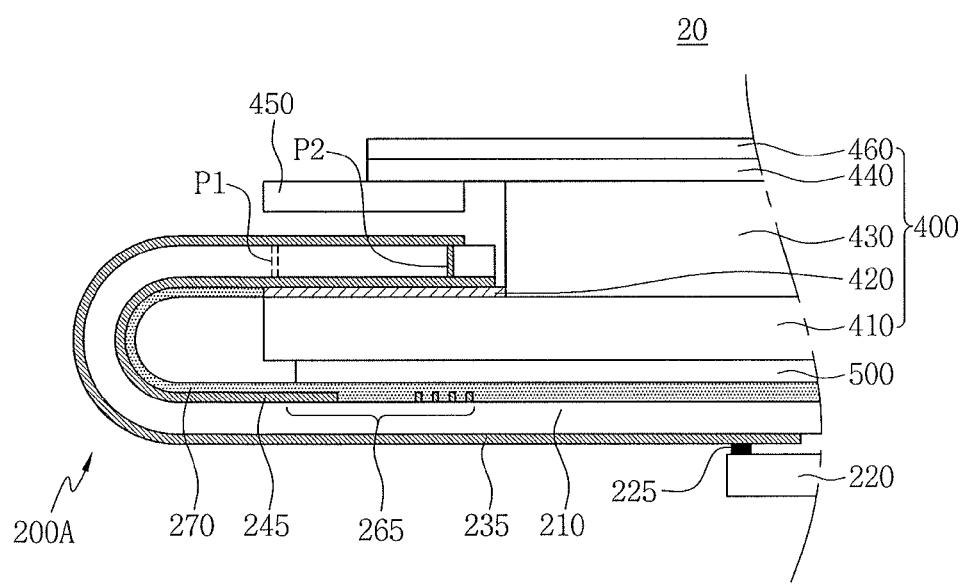

FIGS. 5A and 5B illustrate coupling cross-sectional views depicting one end of an apparatus assembly according to another embodiment. FIGS. 5A and 5B schematically illustrate one end of a display apparatus 20 in which the COF package 200 and 200A described with reference to FIGS. 2A to 2F and an external circuit are bonded to each other. In the embodiment, the apparatus assembly 20 may be a display apparatus, and the external circuit 400 may be a panel unit 400. In the embodiment, the panel unit 400 may be the same as the panel unit 400 described in FIGS. 4A and 4B, and thus detailed description of components of the panel unit 400 which may be the same as those of the panel unit 400 of FIGS. 4A and 4B will not be repeated.

Like the embodiment illustrated in FIGS. 1A to 1G, after a test for the COF package 200 according to the embodiment illustrated in FIGS. 2A to 2F is completed, and an unnecessary portion of the COF package 200 is cut, a subsequent process of bonding one end of the cut COF package 200A to one end of the panel unit 400 may be performed.

Referring to FIG. 5A, a first connection lead 240 of the cut COF package 200A according to the embodiment illustrated in FIGS. 2A to 2F and an interconnection 420 of the panel unit 400 may be directly bonded to each other. A first lead 230 may be electrically connected to the interconnection 420 of the panel unit 400 through a first via plug P1 and the first connection lead 240.

Referring to FIG. 5B, a second connection lead 245 of the cut COF package 200A according to the embodiment illustrated in FIGS. 2A to 2F and the interconnection 420 of the panel unit 400 may be directly bonded to each other. A second lead 235 may be electrically connected to the interconnection 420 of the display panel 400 through a second via plug P2 and the second connection lead 245.

After the one end of the cut COF package 200A according to the embodiment illustrated in FIGS. 2A to 2F is bonded to the one end of the panel unit 400 as illustrated in FIGS. 5A and 5B, the other end of the cut COF package 200A is bent to be disposed in a bottom of the panel unit 400 (for example, a bottom of a panel substrate 410). The bent film substrate 210 and the panel substrate 410 may be adhered to each other through a predetermined adhesive 500.

An area in which the second connection lead 245 partially left in the area other than the bonding area BA in the cut COF package 200A is formed may be wide. There could be a risk that the second connection lead 245 may come into contact with the panel substrate 410 in the bending of the second connection lead 245. Accordingly, an insulating layer 270 may be further included between the panel substrate 410 and the second connection lead 245. The insulating layer 270 may be formed to be deposited on the second connection lead 245 partially left in the area other than the bonding area BA before the bending is performed so that the COF package 200A is disposed in the bottom of the panel substrate 410.

The process of depositing the insulating layer 270 may be omitted when the first and second connection leads or the first and second pads used in the test in the area other than the bonding area BA are not in contact with the external circuit as illustrated in FIGS. 4A and 4B, or when the first and second connection leads or the first and second pads used in the test are not left in the area other than the bonding area BA.

Figure 6A:
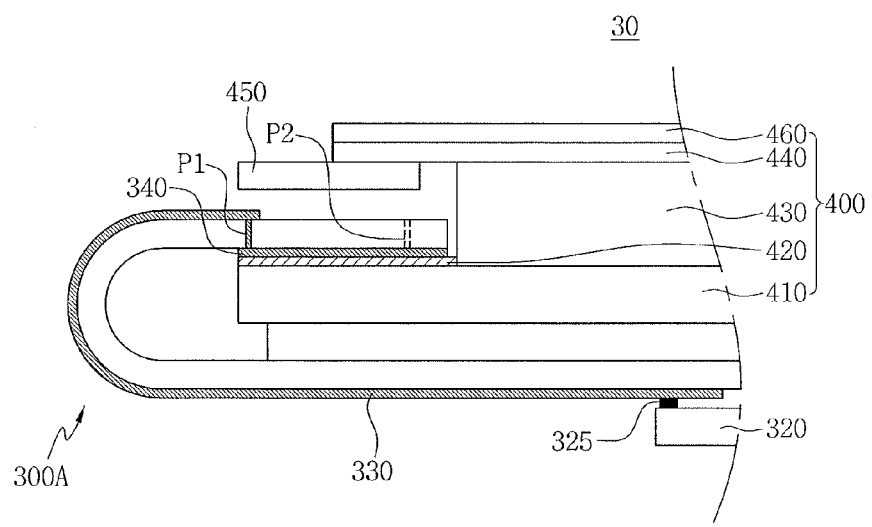
FIGS. 6A and 6B illustrate coupling cross-sectional views depicting one end of an apparatus assembly according to the embodiment illustrated in FIGS. 3A-3F.
Figure 6B:
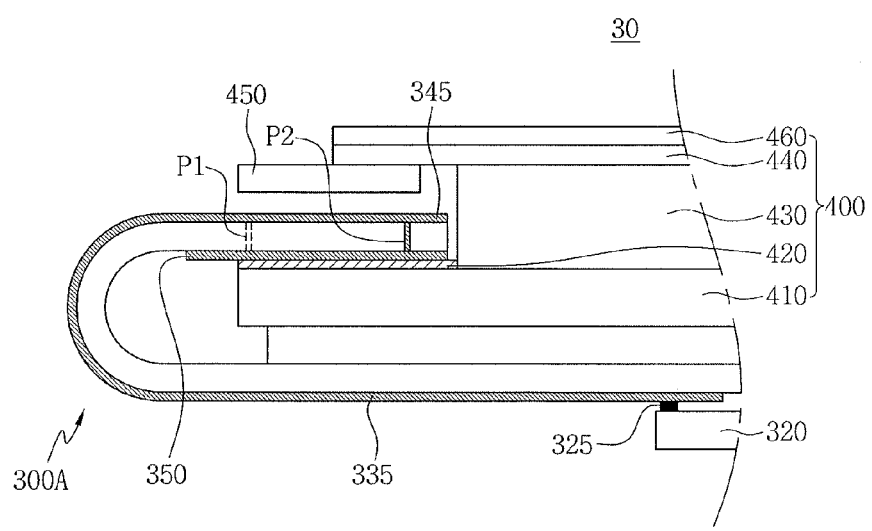

FIGS. 6A and 6B illustrate coupling cross-sectional views depicting one end of an apparatus assembly according to another embodiment. FIGS. 6A and 6B schematically illustrate a portion of an apparatus assembly 30 in which the COF packages 300 and 300A described with reference to FIGS. 3A to 3H and an external circuit 400 are bonded to each other. In the embodiment, the apparatus assembly 30 may be a display apparatus, and the external circuit 400 may be a panel unit 400. In the embodiment, the panel unit 400 may be the same as the panel unit 400 described in FIGS. 4A and 4B, and thus detailed description of components of the panel unit 400, which may be the same as those of the panel unit 400 of FIGS. 4A and 4B will not be repeated.

Like the embodiment illustrated in FIGS. 4A and 4B, after a test for the COF package 300 according to the embodiment illustrated in FIGS. 3A to 3H is completed, a subsequent process of bonding one end of the cut COF package 300A to one end of the panel unit 400 may be performed.

Referring to FIG. 6A, a first connection lead 340 of the cut COF package 300A according to the embodiment illustrated in FIGS. 3A to 3H and an interconnection 420 of the panel unit 400 may be directly bonded to each other. A first lead 330 may be electrically connected to the interconnection 420 of the panel unit 400 through a first via plug P1 and the first connection lead 340.

Referring to FIG. 6B, a third connection lead 350 of the cut COF package 300A according to the embodiment illustrated in FIGS. 3A to 3H and the interconnection 420 of the panel unit 420 may be directly bonded to each other. A second lead 335 may be electrically connected to the interconnection 420 of the panel unit 400 through a second via plug P2 and the third connection lead 350.

After the one end of the cut COF package 300A according to the embodiment illustrated in FIGS. 3A to 3H is bonded to the one end of the panel unit 400 as illustrated in FIGS. 6A and 6B, the other end of the cut COF package 300A may be bent to be disposed in a bottom of the panel unit 400 (for example, a bottom of a panel substrate 410), and the bent film substrate 310 and the panel substrate 410 may be adhered to each other through a predetermined adhesive 500.

By way of summation and review, in general, chip on film (COF) package technology using a flexible film substrate has received attention as high-integration package technology. Display apparatuses using the related COF package technology have gradually increased in resolution, and a pitch between outer leads has been increasingly reduced according to increase in the number of channels of a driver IC of the COF package due to the increase of the resolution. Therefore, the size of a pad for testing the semiconductor chip through an outer lead for a final test in the COF package has necessarily been reduced due to a space limitation.

When the size of the pad is reduced, accuracy and reliability of the test may be degraded due to contact failure that may occur in bonding the pad to a panel. Accordingly, the lifespan of a probe card may be reduced due to a reduction in a size of a needle used to probe the pad.

Embodiments provide new COF package technology capable of increasing a size of a pad by easily ensuring a space in which a pad for testing a semiconductor chip through an outer lead is to be formed when the number of channels of the COF package is increased.

Embodiments provide a COF package including a film of a COF package that has a double-layered structure and distributed via plugs.

As described above, the COF package according to various technical aspects may be implemented such that the film of the COF package has a double-layered structure through a via plug penetrating a film substrate so that accuracy and reliability of the test for the leads may be improved. A plurality of pads configured to test a plurality of leads may be efficiently distributed without reducing in a size of the pad or by increasing the size of the pad in a limited space.

The COF packages according to various embodiments may easily ensure a space for forming pads for corresponding leads even when the number of channels of the semiconductor chip is increased to implement high performance. Thus, a yield of the COF package may be improved.

The COF packages according to various embodiments may be implemented such that a film of the COF package has a double-layered structure through a via plug penetrating a film substrate to improve integration degree of leads and via plugs.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A chip on film (COF) package, comprising:
a film substrate;
first leads on a first surface of the film substrate, the first leads having a first length, and second leads on the first surface of the film substrate, the second leads having a second length larger than the first length;
first via plugs penetrating the film substrate and connected to first ends of the first leads, and second via plugs penetrating the film substrate and connected to first ends of the second leads; and
first connection leads on a second surface of the film substrate facing the first surface, the first connection leads having first ends connected to the first via plugs, and second connection leads on the second surface of the film substrate, the second connection leads having first ends electrically connected to the second via plugs.

2. The COF package as claimed in claim 1, further comprising a semiconductor chip on the first surface of the film substrate, the semiconductor chip being electrically connected to second ends of the first leads and second ends of the second leads.

3. The COF package as claimed in claim 2, wherein the first ends of the first leads are relatively close to the semiconductor chip, and the first ends of the second leads are relatively far from the semiconductor chip.

4. The COF package as claimed in claim 2, wherein the first via plugs are relatively close to the semiconductor chip, and the second via plugs are relatively far from the semiconductor chip.

5. The COF package as claimed in claim 2, wherein:
the first connection leads extend from the first via plugs to an opposite direction of the semiconductor chip, and
the second connection leads extend from the second via plugs toward the semiconductor chip.

6. The COF package as claimed in claim 5, wherein the first connection leads and the second connection leads are parallel to each other between the first via plugs and the second via plugs.

7. The COF package as claimed in claim 5, wherein:
the first connection leads extend to pass between the second via plugs, and
the second connection leads extend to pass between the first via plugs.

8. The COF package as claimed in claim 1, wherein the first leads and the second leads are parallel to each other between the first via plugs and the second via plugs on the second surface of the film substrate.

9. The COF package as claimed in claim 1, further comprising:
first pads at second ends of the first connection leads; and
second pads at second ends of the second connection leads.

10. The COF package as claimed in claim 1, wherein the first connection leads or the second connection leads have bending portions.

11. The COF package as claimed in claim 1, wherein:
the first via plugs form an imaginary first straight line,
the second via plugs form an imaginary second straight line, and
the first straight line and the second straight line are parallel to each other.

12. A chip on film (COF) package, comprising:
a film substrate;
a semiconductor chip on a first surface of the film substrate;
first leads on the first surface of the film substrate, the first leads extending from the semiconductor chip to a first length to have first ends;
second leads on the first surface of the film substrate, the second leads extending from the semiconductor chip to a second length larger than the first length to have first ends;
first via plugs penetrating the film substrate and connected to the first ends of the first leads, and second via plugs penetrating the film substrate and connected to the first ends of the second leads;
first connection leads on a second surface of the film substrate facing the first surface, the first connection leads having first ends connected to the first via plugs; and
second connection leads disposed on the first surface of the film substrate, the second connection leads being electrically connected to the first ends of the second leads.

13. The COF package as claimed in claim 12, further comprising third connection leads on the second surface of the film substrate, the third connection leads being connected to the second via plugs.

14. The COF package as claimed in claim 13, wherein the third connection leads extend from the second via plugs toward the semiconductor chip.

15. The COF package as claimed in claim 13, wherein the first connection leads and the third connection leads are parallel to each other in a region between the first via plugs and the second via plugs on the second surface of the film substrate.

16. A film of a chip on film (COF) package, the film comprising:
a film substrate;
first leads on a first surface of the film substrate, the first leads extending from a semiconductor chip and having a first length;
second leads on the first surface of the film substrate, the second leads extending from the semiconductor chip having a second length longer than the first length;
first via plugs penetrating the film substrate and connected to first ends of the first leads;

second via plugs penetrating the film substrate and connected to the second leads;

first connection leads on a second surface of the film substrate facing the first surface, the first connection leads having first ends connected to the first via plugs and second ends that form first pads on the second surface, the first connection leads extending from the first via plugs in a direction toward the semiconductor chip; and second connection leads on the second surface of the film substrate, the second connection leads having first ends electrically connected to the second via plugs and the second connection leads extending in an opposite direction from the semiconductor chip.

17. The film as claimed in claim 16, wherein the second connection leads include second ends that form second pads on the second surface.

18. The film as claimed in claim 16, wherein second leads extend on the first surface from the semiconductor chip to beyond the second via plugs and terminate in second pads on the first surface.

* * * * *